(12) United States Patent
Aoki et al.

(10) Patent No.: US 6,609,909 B2
(45) Date of Patent: Aug. 26, 2003

(54) HEAT TREATMENT APPARATUS AND METHOD

(75) Inventors: Taiichiro Aoki, Kanagawa (JP); Akihiko Nakamura, Kanagawa (JP); Akinori Nishie, Okayama (JP)

(73) Assignee: Tokyo Ohka Kogyo C., Ltd., Kanagawa (JP)

( * ) Notice: Subject to any disclaimer, the term of this patent is extended or adjusted under 35 U.S.C. 154(b) by 64 days.

(21) Appl. No.: 09/981,633

(22) Filed: Oct. 17, 2001

(65) Prior Publication Data

US 2002/0081108 A1 Jun. 27, 2002

(30) Foreign Application Priority Data

Oct. 19, 2000 (JP) .......................................... 2000-319210

(51) Int. Cl.[7] .................................................. F27D 5/00
(52) U.S. Cl. ........................ 432/258; 414/936; 118/724; 118/729
(58) Field of Search ................................. 432/241, 253, 432/258; 414/697, 936; 118/724, 728, 729; 219/390, 405, 444.1

(56) References Cited

U.S. PATENT DOCUMENTS

| | | | |
|---|---|---|---|
| 5,201,653 A | * | 4/1993 | Hasegawa et al. ............. 432/170 |
| 5,431,700 A | * | 7/1995 | Sloan ............................... 29/25.01 |
| 5,462,603 A | * | 10/1995 | Murakami ........................ 118/719 |
| 6,062,852 A | * | 5/2000 | Kawamoto et al. ............. 432/258 |

* cited by examiner

Primary Examiner—Gregory Wilson
(74) Attorney, Agent, or Firm—Carrier, Blackman & Associates, P.C.; Joseph P. Carrier; William D. Blackman

(57) ABSTRACT

A heat treatment apparatus comprises: a chamber; a cooling plate and a heating plate disposed within the chamber vertically spaced from each other; plural lift pins used to support a material to be treated; a supporting member for supporting the plural lift pins; and an elevator member to which the supporting member is attached through a joint so that the supporting member can be selectively made rotatable and can be fixed at any inclined angle, wherein distances of tips of each of the lift pins from the heating or cooling plate are initially adjusted to be uniform through inclination of the supporting member while the tips contact the heating or cooling plate, after which the supporting member is fixed in an adjusted inclined angle and then the material to be treated is lifted up with the plural lift pins to closely approach the heating or cooling plate during heat treatment.

15 Claims, 1 Drawing Sheet

HEAT TREATMENT APPARATUS AND METHOD

BACKGROUND OF THE INVENTION

1. Field of the Invention

The present invention relates to an apparatus for conducting heating/cooling treatment for treating a plate-like material such as a semiconductor wafer, a glass substrate, a ceramic substrate or the like, and a heating/cooling treatment method thereof.

2. Description of Prior Art

Conventionally, for forming an integrated circuit on the surface of a plate-like material to be treated such a semiconductor wafer, a glass substrate or the like, the surface of the plate-like material to be treated is covered with a resist mask having a predetermined pattern and various kinds of treatments, such as a CVD method or an etching process, are conducted onto the resist mask. In particular, recently, because of the high integration and the high density of circuits, fine processing has been required more and more. Also, in order to meet such a demand, formation of a resist film or an insulating film having high accuracy has been required.

For fine processing, a resist film having high sensitivity is necessary. It has been acknowledged that quenching a resist film formed by heat treatment is effective for heightening the sensitivity.

In a case of forming an insulating film on the surface of a material to be treated, for forming an insulating film having lower permittivity, it is required that the oxidation of the film be prevented by cooling the film in advance of exposing it to air.

A conventional heat treatment apparatus is known, in which a cooling plate and a heating plate are provided and are arranged vertically one above the other within a chamber, for quenching a material to be treated just after heating or successively conducting heating and cooling in a non-oxidizing atmosphere. In this apparatus, a material to be treated is heated on the heating plate provided, for example, at the lower portion of the chamber, the material to be treated is lifted up by means of a lift pin to be adjacent to the cooling plate provided at the upper portion of the chamber, and a resist film or an insulating film formed on the surface of the material to be treated is quenched.

However, the conventional apparatus having a heating plate and a cooling plate provided in a chamber has a drawback that the heating plate or the cooling plate is deformed because the temperature gradient is extremely large within the chamber. Also, there is another drawback that a supporting member is deformed by the temperature variation and the material to be treated cannot be held reliably in a horizontal position. Accordingly, even if the material to be treated is set to be parallel with either of the heating plate or the cooling plate which is provided at the lower portion when the material is lifted up with the lift pin, heat treatment gradually deforms the heating plate or the cooling plate and affects the parallel arrangement.

Further, in the conventional apparatus, since it is not possible to accurately measure the distance between the heating plate or the cooling plate and the surface of the material to be treated under the treatment, it is very hard to control the temperature of the material to be treated.

Specifically, if a heating plate of 500° C. is provided at the lower portion of a chamber, a cooling plate of 28° C. is provided at the upper portion of the chamber, and the distance between the surface of a material to be treated and the cooling plate is set at 70 mm, dislocation of 1 mm in the distance causes a temperature difference of 45° C. around the cooling plate in such a heat treatment apparatus.

SUMMARY OF THE INVENTION

According to the present invention, for the purpose of overcoming the drawbacks mentioned above, there is provided a heat treatment apparatus comprising a chamber, a cooling plate and a heating plate, plural lift pins, a supporting member for supporting the plural lift pins, and an elevator member to which the supporting member is attached through a joint so that the supporting member can move while inclining relative horizontal and can be fixed at any inclined angle, wherein a material to be treated is lifted up with the plural lift pins and thereby the surface of the material to be treated is allowed to approach the heating plate or the cooling plate very closely.

With such a structure, it is possible to automatically adjust the distance and the parallel condition between the heating plate or the cooling plate and the material to be treated.

In a case where the heating plate and the cooling plate are provided in a parallel orientation, arranged in vertical alignment and vertically separated from one another, the heat treatment apparatus mentioned above has a structure for allowing the lift pins to penetrate either of the heating plate or the cooling plate which is located in the lower portion.

Also, when a detecting mechanism such as an air micrometer for detecting the distance between the heating plate or the cooling plate located in the upper portion and the surface of the material to be treated is provided, for example, in the upper plate, the distance between the material to be treated under the treatment and the plate can be measured.

As the joint, a spherical bearing having a movable portion and a fixed portion can be used. By feeding gas to between the opposing surfaces of the movable portion and the fixed portion, it is possible to make the supporting member movable in an inclined condition. By aspirating the gas, it is possible to fix the supporting member. An electromagnetic force may be used instead of gas.

According to the present invention, there is also provided a heat treatment method using the heat treatment apparatus mentioned above, comprising the steps of bringing the supporting member into a condition where inclining movement is possible, elevating the plural lift pins without having a material to be treated mounted thereon, making the upper edge of all lift pins push onto the lower surface of the heating plate or the cooling plate which is provided in the upper portion of the chamber, fixing the movable portion of the bearing with respect to the fixed portion of the bearing, lowering the lift pins, mounting a material to be treated on the lift pins, elevating the lift pins again, allowing the surface of the material to be treated to approach the heating plate or the cooling plate which is provided in the upper portion of the chamber, and conducting heat treatment.

DETAILED DESCRIPTION OF PREFERRED EMBODIMENT(S)

Hereinafter, embodiments according to the present invention will be explained with reference to the attached drawings.

Figure 1:
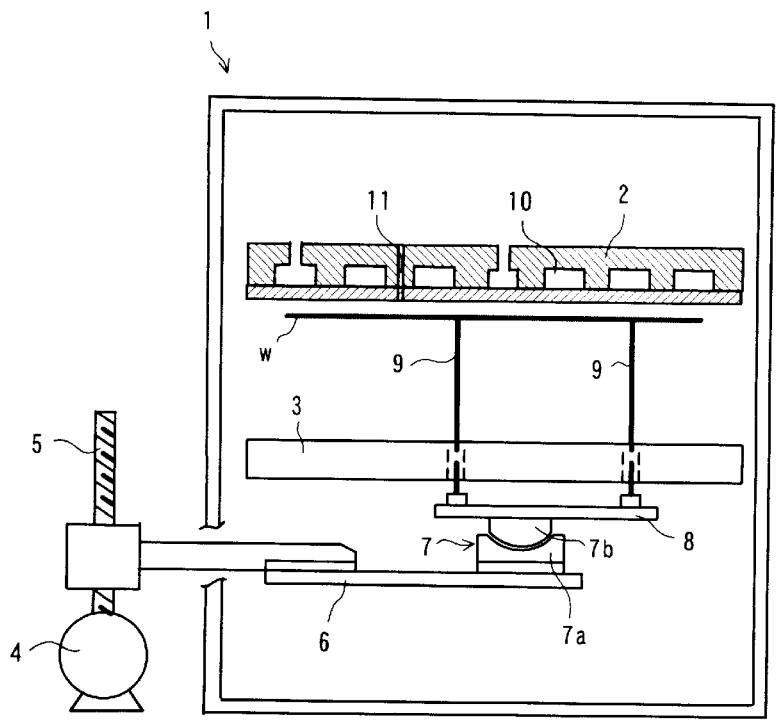
FIG. 1 shows a schematic view of a heat treatment apparatus according to the present invention.

As shown in FIG. 1, in the heat treatment apparatus according to the present invention, a cooling plate 2 is provided at the upper portion of a chamber 1, a heating plate 3 is provided at the lower portion of the chamber 1, and each plate is provided horizontally.

A feed screw 5 is provided at the outside of the chamber 1, which screw is driven by a motor 4. A base nut of an arm 6 is engaged with the feed screw 5, and the arm 6 is elevated and lowered by driving of the motor 4.

Figure 2:
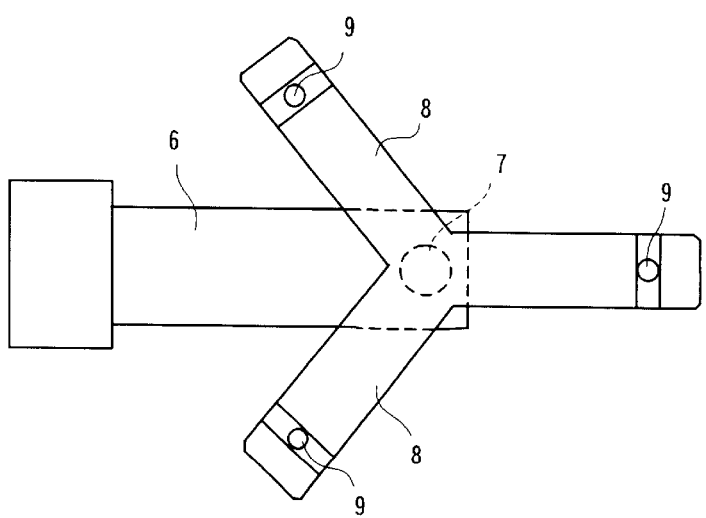
FIG. 2 shows a plane view of a supporting member for lift pins according to the present invention.

Also, a supporting plate 8 is attached to the end portion of the arm 6 through a spherical bearing 7. As shown in FIG. 2, the supporting plate 8 is extended to three directions, and lift pins 9 are attached to each end of the extended portions. Each lift pin 9 penetrates the heating plate 3 and extends therethrough to the space between the cooling plate 2 and the heating plate 3.

The spherical bearing 7 is comprised of a fixed portion 7a having a concave surface and a movable portion 7b having a convex surface. The fixed portion 7a is attached to the arm 6 and the movable portion 7b is attached to the supporting plate 8. Either of the fixed portion 7a and the movable portion 7b is made hollow. By projecting nitrogen gas or air through the hollow portion to the gap between the fixed portion 7a and the movable portion 7b, the supporting plate 8 can move in an inclined condition of an arbitrary angle with extremely small force. By aspirating such gas or air through the hollow portion, the attraction between the fixed portion 7a and the movable portion 7b can be obtained, and thereby the inclined angle at the moment of aspiration can be fixed.

A passage 10 for a cooling medium and a gas projecting hole 11 are provided in the cooling plate 2. The hole 11 functions as an air micrometer. Specifically, the upper portion of the hole 11 is connected through a pipe to a sensor which can detect differential pressure, the change in pressure depending on the resistance to the gas is detected by the sensor, and the distance between the cooling plate 2 and a material to be treated W is accurately measured based upon the detected change in pressure.

Next, a heat treatment method using the above-mentioned apparatus will be explained. Gas is introduced into the gap between the fixed portion 7a and the movable portion 7b of the bearing 7, and thereby the supporting plate 8 is brought into a condition where inclining movement is possible. The lift pins 9, without a material to be treated W mounted thereon, are elevated by driving of the motor 4, and thereby the upper edges of all (three) lift pins are made to push onto the lower surface of the cooling plate 2. The movable portion 7b is fixed with respect to the fixed portion 7a by aspirating the gas, and, keeping this condition, the lift pins 9 are lowered together with the supporting plate 8. After this, a material to be treated W is mounted on the lift pins 9, the lift pins 9 are elevated again, the surface of the material to be treated W is allowed to approach the cooling plate 2. Then, heat treatment is conducted.

In the embodiment shown in the drawing, the cooling plate 2 is provided at the upper portion and the heating plate 3 is provided at the lower portion. However, the converse is possible.

As is explained in the above, according to the present invention, with the structure in which a material to be treated is supported from the bottom thereof by the plural lift pins, the material to be treated is allowed to approach the heating plate or the cooling plate which is provided at the upper portion of the chamber, and the supporting member for supporting the plural lift pins can move in an inclined condition and can be fixed at any inclined angle, it is possible to conduct treatment of heating or cooling while keeping the material to be treated in an accurately horizontal or parallel position with respect to the heating plate or the cooling plate. As a result of this, it is possible to conduct uniform treatment having no unevenness in heating or cooling.

Although there have been described what are the present embodiments of the invention, it will be understood by persons skilled in the art that variations and modifications may be made thereto without departing from the gist, spirit or essence of the invention.

What is claimed is:

1. A heat treatment apparatus, comprising:
    a chamber;
    a cooling plate and a heating plate;
    plural lift pins;
    a supporting member for supporting said plural lift pins; and
    an elevator member to which said supporting member is attached through a joint so that said supporting member can move inclining and can be fixed at any inclined angle,
    wherein a material to be treated is lifted up with said plural lift pins and thereby the surface of said material to be treated is allowed to approach said heating plate or said cooling plate.

2. A heat treatment apparatus according to claim 1, wherein said heating plate and said cooling plate are provided in parallel and arranged separately one above the other within said chamber, and said lift pins are allowed to penetrate either of said heating plate or said cooling plate which is located in a lower portion of said chamber.

3. A heat treatment apparatus according to claim 1, wherein a detecting mechanism for detecting the distance between said heating plate or said cooling plate which is located in an upper portion of said chamber and the surface of the material to be treated is provided.

4. A heat treatment apparatus according to claim 3, wherein said detecting mechanism comprises an air micrometer.

5. A heat treatment apparatus according to claim 1, wherein:
    said joint is a spherical bearing having a movable portion and a fixed portion;
    said supporting member is made to be rotatable relative to said elevator member by feeding gas between opposing surfaces of said movable portion and said fixed portion; and
    said supporting member is fixed against rotation by aspirating the gas.

6. A heat treatment method using a heat treatment apparatus according to claim 1, comprising the steps of:
    bringing said supporting member into a condition where inclining movement is possible;
    elevating said plural lift pins without having a material to be treated mounted thereon so that upper edges of all said lift pins push onto the lower surface of said heating plate or said cooling plate which is provided in an upper portion of said chamber;
    fixing said movable portion of said bearing with respect to said fixed portion of said bearing;
    lowering said lift pins;
    mounting a material to be treated on said lift pins;

elevating said lift pins again;

allowing the surface of said material to be treated to approach said heating plate or said cooling plate which is provided in the upper portion of said chamber; and conducting heat treatment.

7. A heat treatment method according to claim 6, wherein said heating plate and said cooling plate are provided in parallel and arranged separately one above the other within said chamber, and said lift pins extend through openings defined in said heating plate or said cooling plate which is located in a lower portion of said chamber.

8. A heat treatment method according to claim 6, the heat treatment apparatus further comprises a detecting mechanism for detecting the distance between said heating plate or said cooling plate which is located in an upper portion of said chamber and the surface of the material to be treated is provided, and said elevating step with said material to be treated mounted on said lift pins involves use of distance detected by said detecting mechanism.

9. A heat treatment method according to claim 8, wherein said detecting mechanism comprises an air micrometer.

10. A heat treatment method according to claim 5, wherein:

said joint is a spherical bearing having a movable portion and a fixed portion;

said supporting member is made to be rotatable relative to said elevator member by feeding gas between opposing surfaces of said movable portion and said fixed portion, and is fixed against rotation by aspirating the gas; and said supporting member is made rotatable during said elevating step when said upper edges of said lift pins push onto the lower surface of said heating plate or said cooling plate.

11. A heat treatment apparatus, comprising:

a chamber;

a cooling plate and a heating plate disposed in vertically spaced relation within said chamber;

plural lift pins which support a material to be treated during heat treatment;

a supporting member for supporting said plural lift pins; and an elevator member which vertically moves said support member and lift pins such that the surface of said material to be treated is allowed to closely approach said heating plate or said cooling plate;

wherein said supporting member being attached to said elevator member through a joint so that said supporting member can be selectively inclined relative to said elevator member and selectively fixed at any inclined angle.

12. A heat treatment apparatus according to claim 11, wherein said heating plate and said cooling plate are provided in parallel and arranged separately one above the other within said chamber, and said lift pins are allowed to penetrate either of said heating plate or said cooling plate which is located in a lower portion of said chamber.

13. A heat treatment apparatus according to claim 11, further including a detecting mechanism for detecting the distance between said heating plate or said cooling plate which is located in an upper portion of said chamber and the surface of the material to be treated.

14. A heat treatment apparatus according to claim 13, wherein said detecting mechanism comprises an air micrometer.

15. A heat treatment apparatus according to claim 11, wherein:

said joint is a spherical bearing having a movable portion and a fixed portion;

said supporting member is made to be rotatable relative to said elevator member by feeding gas between opposing surfaces of said movable portion and said fixed portion; and said supporting member is fixed against rotation by aspirating the gas.

* * * * *

UNITED STATES PATENT AND TRADEMARK OFFICE
CERTIFICATE OF CORRECTION

PATENT NO. : 6,609,909 B2
DATED : August 26, 2003
INVENTOR(S) : Taiichiro Aoki et al.

It is certified that error appears in the above-identified patent and that said Letters Patent is hereby corrected as shown below:

Title page,
Item [75], change "[75] Inventors: Taiichiro Aoki, Kanagawa (JP); Akihiko Nakamura, Kanagawa (JP); Akinori Nishie, Okayama (JP)" to
-- [75] Inventors: Taiichiro Aoki, Kanagawa (JP); Akihiko Nakamura, Kanagawa (JP); Yasuyuki Sato, Okayama (JP); Toshinori Imai, Okayama (JP); Akinori Nishie, Okayama (JP) --.
Item [73], change "[73] Assignee: Tokyo Ohka Kogyo C., Ltd.," to
-- [73] Assignee: Tokyo Ohka Kogyo Co., Ltd., --.

Column 1,
Line 15, change "surface of a plate-like material to be treated such a semi-" to
-- surface of a plate-like material to be treated such as a semi- --.
Line 28, change "film formed by heat treatment is effective for heightening the" to -- film formed by heat treatment is effective for heightening its --.

Column 2,
Line 14, change "move while inclining relative horizontal and can be fixed at" to -- move while inclining relative to horizontal and can be fixed at --.

Column 5,
Line 12, change "8. A heat treatment method according to claim 6, the heat" to -- 8. A heat treatment method according to claim 6, wherein the heat --.

UNITED STATES PATENT AND TRADEMARK OFFICE
CERTIFICATE OF CORRECTION

PATENT NO. : 6,609,909 B2
DATED : August 26, 2003
INVENTOR(S) : Taiichiro Aoki et al.

It is certified that error appears in the above-identified patent and that said Letters Patent is hereby corrected as shown below:

<u>Column 5 cont'd,</u>
Line 22, change "10. A heat treatment method according to claim 5," to
-- 10. A heat treatment method according to claim 6, --.

Signed and Sealed this

Twenty-third Day of March, 2004

JON W. DUDAS
*Acting Director of the United States Patent and Trademark Office*